US008586189B2

(12) United States Patent
Ito et al.

(10) Patent No.: US 8,586,189 B2
(45) Date of Patent: Nov. 19, 2013

(54) GAS-BARRIER FILM AND ORGANIC DEVICE COMPRISING SAME

(75) Inventors: Shigehide Ito, Kanagawa (JP); Takeshi Senga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 679 days.

(21) Appl. No.: 12/211,498

(22) Filed: Sep. 16, 2008

(65) Prior Publication Data

US 2009/0072230 A1  Mar. 19, 2009

(30) Foreign Application Priority Data

Sep. 19, 2007  (JP) .................. 2007-241966
May 29, 2008  (JP) .................. 2008-140981

(51) Int. Cl.
*B32B 9/04* (2006.01)
*B32B 13/12* (2006.01)
*C01C 1/02* (2006.01)
*H01L 21/311* (2006.01)

(52) U.S. Cl.
USPC ........... 428/446; 428/447; 428/448; 428/451; 423/353; 438/738

(58) Field of Classification Search
None
See application file for complete search history.

(56) References Cited

U.S. PATENT DOCUMENTS

| 7,088,322 | B2 * | 8/2006 | Koyama et al. ............... 345/87 |
| 8,026,578 | B2 * | 9/2011 | Akedo et al. ................. 257/640 |
| 2004/0166362 | A1 | 8/2004 | Utsumi et al. |
| 2005/0282316 | A1* | 12/2005 | Young et al. ................. 438/149 |
| 2006/0051910 | A1* | 3/2006 | Tanabe ........................ 438/152 |
| 2007/0069233 | A1* | 3/2007 | Yan et al. .................... 257/103 |
| 2008/0085418 | A1* | 4/2008 | Fukuda et al. ............... 428/447 |
| 2009/0075098 | A1* | 3/2009 | Tsukahara et al. ........... 428/451 |
| 2009/0291293 | A1* | 11/2009 | Sakakura ..................... 428/323 |

FOREIGN PATENT DOCUMENTS

| JP | 8-68990 A | 3/1996 |
| JP | 2003-51382 A | 2/2003 |
| JP | 2005-203321 A | 7/2005 |
| JP | 2006-263929 A | 10/2006 |
| JP | 2006-297694 A | 11/2006 |
| WO | WO-2004/030074 A1 | 4/2004 |
| WO | WO-2005/104206 A1 | 11/2005 |
| WO | WO 2006/033233 | * 3/2006 |

OTHER PUBLICATIONS

European Office Action issued Nov. 17, 2009, in corresponding EP 08 016 444.5.

Kattamis et al., "Effect of $SIN_X$ Gate Dielectric Deposition Power and Temperature on a—SkH TFT Stability", IEEE Electron Device Letters, vol. 28, No. 7, Jul. 2007, pp. 606-608.

(Continued)

*Primary Examiner* — Jennifer Chriss
*Assistant Examiner* — Camie Thompson
(74) *Attorney, Agent, or Firm* — Birch, Stewart, Kolasch & Birch, LLP

(57) ABSTRACT

A gas-barrier film comprising at least one silicon hydronitride layer and at least one silicon nitride layer on a surface of a flexible supporting substrate. The film has an excellent gas-barrier property.

15 Claims, 2 Drawing Sheets

(56) References Cited

OTHER PUBLICATIONS

Ohishi T., "Gas barrier characteristics of polysilazane film formed on an ITO-coated PET substrate" Journal of Non-Crystalline Solids vol. 330 (2003), pp. 248-251.

Winderbaum S., et al., "Application of plasma enhanced chemical vapor deposition silicon nitride as a double layer antireflection coating and passivation layer for polysilicon solar cell", Journal of Vacuum Science and Technology; Part A, vol. 15, No. 3, May 1997, pp. 1020-1025. XP000729040.

Hong Y., et al., "Transparent Flexible Plastic Substrates for Organic Light-Emitting Devices" Journal of Electronic Materials, vol. 33, No. 4, Apr. 2004, pp. 312-320. XP002514829.

Chinese Office Action dated May 30, 2012, for Application No. 200810165630.9 with the English translation.

Japanese Office Action dated Apr. 24, 2012, for Application No. 2008-140981 with the English translation.

Chinese Decision of Rejection, dated May 23, 2013, for Chinese Application No. 200810165630.9.

* cited by examiner

GAS-BARRIER FILM AND ORGANIC DEVICE COMPRISING SAME

BACKGROUND OF THE INVENTION

1. Field of the Invention

The present invention relates to a gas-barrier film having excellent water vapor-barrier properties and to an organic device comprising the gas-barrier film.

2. Description of the Related Art

Heretofore made are investigations of films for use for organic devices. For example, JP-A 2003-51382 discloses a film for organic devices having a coating film on the surface of a polymer film, wherein the coating film is formed of an inorganic polymer comprising silicon, nitrogen, hydrogen and oxygen. JP-A 8-68990 discloses a gas-barrier, poorly moisture-permeable, insulating substrate for transparent electrodes prepared by laminating at least one transparent thin film layer of a nitride and at least one transparent thin film layer of an oxide, on at least one surface of a transparent substrate.

SUMMARY OF THE INVENTION

Having investigated these, however, the present inventors have known that the film described in JP-A 2003-51382 is problematic in that its moisture permeability is high, or that is, its barrier properties are not good. This is because, in this patent reference, a silazane solution is applied onto a base to form the coating film thereon. On the other hand, the substrate described in JP-A B-68990 does not have sufficient gas-barrier properties. This is because the laminate of a transparent thin film of a nitride and a transparent thin film of an oxide described in JP-A 8-68990 could not have sufficient barrier properties. The reason may be because of the thinness of the transparent thin film of a nitride; however, it has been found that, when the transparent thin film of a nitride is thickened, then the film is readily cracked.

The present invention is to solve these problems, and to provide a gas-barrier film having good gas-barrier properties.

Given that situation, the present inventors have assiduously studied and, as a result, have found that, when both a silicon nitride layer that is dense and has good water vapor shieldability and a silicon hydronitride layer that has an ability to react with water vapor to change into SiOx, or that is, a water vapor-capturing function are provided on a substrate, then the above-mentioned problems can be solved. Specifically, for attaining good gas-barrier properties, needed is a dense silicon nitride layer that is thick in some degree. However, a thick silicon nitride layer is problematic in that the increase in its thickness may result in the increase in the probability of generation of pin holes and cracks in the layer. The generation of pin holes and cracks may be prevented by additionally providing a silicon oxynitride layer or by reducing the thickness of the silicon nitride layer, which, however, is still problematic as worsening the gas-barrier properties of the film. Given that situation, the present inventors have further studied and, as a result, have found that lamination of a silicon nitride layer and a silicon hydronitride layer that is more flexible than the silicon nitride layer may relax the stress to be given to the silicon nitride layer and the laminate film is thereby hardly cracked. In addition, the inventors have further found that the silicon hydronitride layer may absorb moisture having leaked out from slightly from the dense silicon nitride layer and therefore the laminate film could express more excellent barrier properties; and on the basis of these findings, the inventors have completed the present invention.

Concretely, the invention includes the following constitutions:

(1) A gas-barrier film having at least one silicon hydronitride layer and at least one silicon nitride layer on the surface of a flexible supporting substrate.

(2) The gas-barrier film of (1), wherein the silicon hydronitride layer and the silicon nitride layer are adjacent to each other.

(3) The gas-barrier film of (2), wherein the composition between the silicon hydronitride layer and the silicon nitride layer changes continuously, not having a definite boundary between them.

(4) The gas-barrier film of any one of (1) to (3), wherein the silicon nitride layer contains silicon oxynitride.

(5) The gas-barrier film of any one of (1) to (4), wherein the silicon hydronitride layer contains silicon hydroxynitride.

(6) The gas-barrier film of any one of (1) to (5), wherein the nitrogen content of the ingredients except silicon in the silicon hydronitride layer is at most 45 mol %, and the hydrogen content thereof is at least 30 mol %.

(7) The gas-barrier film of any one of (1) to (6), wherein the thickness of the silicon hydronitride layer in the gas-barrier film is from 50 to 300 nm.

(8) The gas-barrier film of any one of (1) to (7), wherein the thickness of the silicon nitride layer in the gas-barrier film is from 10 to 300 nm.

(9) The gas-barrier film of any one of (1) to (8), wherein the gas-barrier film has at least one organic layer.

(10) The gas-barrier film of (9), wherein the organic layer in the gas-barrier film contains at least one of a bifunctional acrylate and a trifunctional acrylate.

(11) The gas-barrier film of (9) or (10), wherein the organic layer in the gas-barrier film is formed by curing a composition containing at least one of a bifunctional methacrylate and a trifunctional methacrylate.

(12) The gas-barrier film of any one of (9) to (11), wherein the organic layer in the gas-barrier film is formed by curing a composition containing at least one bisphenol-based (meth)acrylate.

(13) The gas-barrier film of any one of (1) to (12), wherein the flexible supporting substrate used in the gas-barrier film is a polyester.

(14) An organic device comprising a gas-barrier film of any one of (1) to (13).

(15) An organic device sealed with a gas-barrier film of any one of (1) to (13).

(16) An organic device comprising an organic device material laminated on a surface of a substrate, wherein the substrate is a gas-barrier film of any one of (1) to (13) and the organic device material is laminated on the side of the inorganic layer formed on the flexible supporting substrate.

(17) The organic device of any one of (14) to (16), wherein the organic device is any of an organic electroluminescent display device, a liquid-crystal display device, a touch panel and a solar cell.

The present invention has made it possible to provide a gas-barrier film having more excellent water vapor-barrier properties. In addition, it has made it possible to provide a gas-barrier film having excellent folding resistance.

Figure 1:
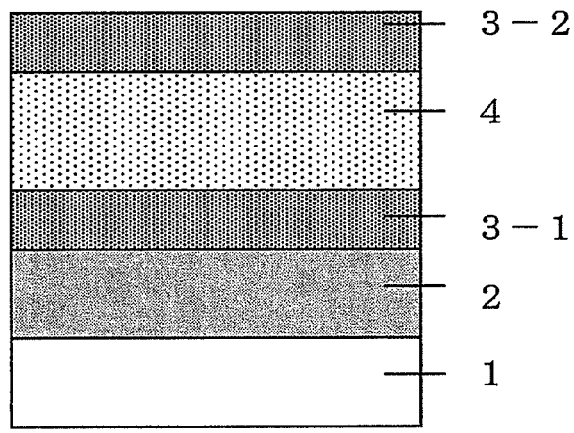
FIG. 1 shows the layer constitution of the gas-barrier film produced in Example 1.

In the drawings, 1 is polyethylene naphthalate film, 2 is organic layer, 2-1, 2-2 and 2-3 are organic layer, 3, 3-1 and 3-2 are silicon nitride layer, 4 is silicon hydronitride layer, and 5-1 and 5-2 are hydrogen composition-changing layer.

BEST MODE FOR CARRYING OUT THE INVENTION

The gas barrier film and the organic device of the invention are hereunder described in detail. The following description of the constitutional requirements is made on the basis of representative embodiments of the invention, but it should not be construed that the invention is limited to those embodiments. In this specification, the numerical range expressed by the wording "a number to another number" means the range that falls between the former number indicating the lowermost limit of the range and the latter number indicating the uppermost limit thereof.

<<Gas-Barrier Film>>
(Constitution of Gas-Barrier Film)

The gas-barrier film of the invention is a film having at least one silicon hydronitride layer and at least one silicon nitride layer on a flexible supporting substrate (e.g., plastic film).

Thus having both a silicon hydronitride layer and a silicon nitride layer, the gas-barrier film keeps good gas-barrier properties and is excellent in folding resistance.

In the gas-barrier film of the invention, the silicon hydronitride layer and the silicon nitride layer may be adjacent to each other, or any other layer (an organic layer, a layer of an inorganic compound, a functional layer, etc.) may be provided between them. The composition between the silicon hydronitride layer and the silicon nitride layer may change continuously, not having any definite boundary between them (this may be hereinafter referred to as "hydrogen composition-changing layer"). Naturally, the constitution of the film of the invention may comprise both at least one of a silicon hydronitride layer and a silicon nitride layer, and such a hydrogen composition-changing layer.

The gas-barrier film of the invention is not specifically defined in point of the other layer constitution so far as a silicon hydronitride layer and a silicon nitride layer are provided on a substrate. Preferably, however, the film has a constitution of at least one organic layer and at least one inorganic layer laminated on a substrate. In this, the inorganic layer is meant to include the silicon hydronitride layer, the silicon nitride layer and the hydrogen composition-changing layer, any other layer of an inorganic compound than those layers, and their laminates.

The gas-barrier film of the invention may have an inorganic layer and an organic layer laminated in that order on a flexible supporting substrate, or may have an organic layer and an inorganic layer laminated in that order thereon. In this, the outermost layer may be an inorganic layer or an organic layer, and a functional layer may be further provided on it.

The gas-barrier film of the invention may have an organic layer and an inorganic layer provided on one surface of a flexible supporting substrate, or may have the layers provided on both surfaces thereof. In case where the layers are provided on both surfaces, the layer constitutions on the two surfaces may be the same or different; and anyhow, the inorganic layers on at least one surface are to be a silicon hydronitride layer and a silicon nitride layer.

Preferred layer constitutions of the gas-barrier film of the invention are shown below.

(1) Flexible supporting substrate/organic layer/inorganic layer (silicon nitride layer/silicon hydronitride layer/silicon nitride layer)

(2) Flexible supporting substrate/organic layer/inorganic layer (silicon nitride layer/hydrogen composition-changing layer/silicon hydronitride layer/hydrogen composition-changing layer/silicon nitride layer)

(3) Flexible supporting substrate/organic layer/inorganic layer (silicon nitride layer)/organic layer/inorganic layer (silicon nitride layer)/organic layer/inorganic layer (silicon hydronitride layer)/organic layer/inorganic layer (silicon nitride layer)

(Silicon Nitride Layer) "Silicon nitride layer" in the invention is a layer comprising silicon nitride as the main ingredient thereof, and for example, this is a layer comprising silicon nitride in an amount of at least 90% by weight. Silicon nitride may be silicon oxynitride. Silicon oxynitride is preferred, as the film comprising it may be more flexible and more transparent.

Preferably, the nitrogen content of the ingredients except silicon in the silicon nitride layer is at least 50 mol %. Within the range, the layer is advantageous in that it may be denser and may have better gas-barrier properties and its flexibility and transparency may be bettered.

The silicon nitride layer may contain any other constitutive ingredient. For example, the additional ingredient includes aluminium oxide, aluminium nitride, aluminium oxynitride, titanium oxide and magnesium oxide.

The thickness of the silicon nitride layer is preferably from 10 to 300 nm, more preferably from 30 to 100 nm.

For forming the silicon nitride layer, employable is any method capable of forming the intended layer. For the layer formation, for example, suitable are a sputtering method, a vacuum vapor deposition method, an ionic plating method and a plasma CVD method; and concretely, the methods described in Japanese Patent 3400324, and JP-A 2002-322561 and 2002-361774 are employable herein.

(Silicon Hydronitride Layer)

"Silicon hydronitride layer" in the invention means a layer comprising silicon hydronitride as the main ingredient thereof, and for example, the layer contains silicon hydronitride in an amount of at least 90% by weight. Silicon hydronitride may be silicon hydroxynitride. Silicon hydroxynitride is preferred, as the silicon hydronitride layer comprising it may be more flexible and more transparent.

Preferably, the nitrogen content of the ingredients except silicon in the silicon hydronitride layer is at most 45 mol %, more preferably at most 30 mol %. The lowermost limit of the nitrogen content of the ingredients except silicon is preferably at least 10 mol %, more preferably at least 15 mol %. Preferably, the hydrogen contents of the ingredients except silicon in the silicon hydronitride layer is at least 30 mol %, more preferably at least 40 mol %. The uppermost limit of the hydrogen content is preferably at most 60 mol %, more preferably at most 55 mol %. Within the range, the layer is advantageous in that its water vapor absorbability is high.

The silicon hydronitride layer may contain any other constitutive ingredient. For example, the additional ingredient includes aluminium oxide, aluminium nitride, aluminium oxynitride, titanium oxide and magnesium oxide.

The thickness of the silicon hydronitride layer is preferably from 50 to 300 nm, more preferably from 100 to 200 nm.

The silicon hydronitride layer may be formed in the same manner as that for the silicon nitride layer.

(Hydrogen Composition-Changing Layer)

In the invention, the silicon nitride layer and the silicon hydronitride layer may be provided as completely different layers, or the composition between the silicon nitride layer and the silicon hydronitride layer may change continuously, therefore forming a hydrogen composition-changing layer not having a definite boundary between the two layers. Providing the hydrogen composition-changing layer of the type is advantageous in that the two layers are hardly delaminated at their boundary and the film can therefore have stable barrier properties resistant to folding.

The hydrogen composition-changing layer may be formed in the same manner as that for the silicon nitride layer, for which, however, the layer is specifically planned so as to have a continuously changing composition. The layer having a continuously changing composition may be formed as follows: For example, in CVD, a starting gas containing the constitutive material for a silicon nitride layer is first introduced into a reaction chamber, and then, while the plasma generation condition in the chamber is kept as such not turning off the power, the gas is changed to a different one that contains the constitutive material for a silicon hydronitride layer and the discharge condition is gradually changed to that suitable to silicon hydronitride layer formation.

(Other Inorganic Layer)

The other inorganic layer in the invention means a layer of a thin film formed of an inorganic material and having a dense structure capable of inhibiting penetration of gaseous molecules therethrough, and for example, it includes a thin film of a metal compound (metal compound thin film).

The ingredient to constitute the inorganic layer is not specifically defined, and may be any one satisfying the above-mentioned properties. For example, employable are oxides, nitrides or oxynitrides of at least one metal selected from a group consisting of Si, Al, In, Sn, Zn, Ti, Cu, Ce and Ta. Preferably, at least one metal is selected from a group consisting of Si, Al, In, Sn, Ti and Zn.

The inorganic layer is a thin film having a dense structure capable of inhibiting penetration of gaseous molecules therethrough, and therefore, the density of the thin film is preferably within a range of from 2.6 g/cm$^3$ to 7.0 g/cm$^3$, more preferably from 2.6 g/cm$^3$ to 6.0 g/cm$^3$. The density of the thin film may be determined, for example, through X-ray reflectiometry of the thin film formed on an Si wafer.

(Flexible Supporting Substrate)

In the gas barrier film of the invention, a plastic film is in general used as the flexible supporting substrate. The plastic film to be used is not particularly limited with respect to the material quality and thickness, etc. so far as it is a film capable of keeping a stacklaminate of an organic layer, an inorganic layer and the like and can be properly chosen depending upon the use purpose or the like. Specific examples of the plastic film include thermoplastic resins such as polyester resins, methacrylic resins, methacrylic acid-maleic acid copolymers, polystyrene resins, transparent fluorocarbon resins, polyimides, fluorinated polyimide resins, polyamide resins, polyamide-imide resins, polyetherimide resins, cellulose acylate resins, polyurethane resins, polyetheretherketone resins, polycarbonate resins, alicyclic polyolefin resins, polyarylate resins, polyethersulfone resins, polysulfone resins, cycloolefin copolymers, fluorene ring-modified polycarbonate resins, alicyclic modified polycarbonate resins, fluorene ring-modified polyester resins and acryloylated compounds.

In the case where the gas barrier film of the invention is used as a substrate of a device such as organic EL devices as described later, it is preferable that the plastic film is composed of a raw material with heat resistance. Specifically, it is preferable that the plastic film is composed of a transparent raw material with high heat resistance having a glass transition temperature (Tg) of 100° C. or higher and/or a linear heat expansion coefficient of not more than 40 ppm/° C. The Tg and linear heat expansion coefficient can be adjusted by an additive or the like. Examples of such a thermoplastic resin include polyethylene naphthalate (PEN: 120° C.), polycarbonate (PC: 140° C.), alicyclic polyolefins (for example, ZEONOR1600, manufactured by Zeon Corporation: 160° C.), polyarylate (PAr: 210° C.), polyethersulfone (PES: 220° C.), polysulfone (PSF: 190° C.), cycloolefin copolymers (COC: a compound described in Example 1 of JP-A-2001-150584: 162° C.), polyimides (for example, NEOPULIM, manufactured by Mitsubishi Gas Chemical Company, Inc.: 260° C.), fluorene ring-modified polycarbonate (BCF-PC, a compound described in JP-A-2000-227603: 225° C.), alicyclic modified polycarbonate (IP-PC, a compound described in JP-A-2000-227603: 205° C.) and acryloyl compound (a compound described in JP-A-2002-80616: 300° C. or higher) (the numerical figure in each of the parentheses indicates Tg). In particular, in the case where the transparency is required, it is preferable to use an alicyclic polyolefin or the like.

In the case where the gas barrier film of the invention is used in combination with a polarizing plate, it is preferable that the gas barrier laminate of the gas barrier film is faced at the inside of a cell and is disposed in the innermost (adjacent to the device). At that time, since the gas barrier film is disposed in the inside of the cell relative to the polarizing plate, a retardation value of the gas barrier film is important. As to a use form of the gas barrier film in such an embodiment, it is preferable that a barrier film using a flexible supporting substrate having a retardation value of not more than 10 nm and a circular polarizing plate ((quarter-wave plate)+(half-wave plate)+(linear polarizing plate)) are stackedlaminated and used, or that a linear polarizing plate is combined with a gas barrier film using a flexible supporting substrate having a retardation value of from 100 nm to 180 nm, which can be used as a quarter-wave plate, and used.

Examples of the flexible supporting substrate having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

In view of the matter that the gas barrier film of the invention is utilized as a device such as organic EL devices, the plastic film must be transparent, namely its light transmittance is usually 80% or more, preferably 85% or more, and more preferably 90% or more. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas barrier film of the invention is used for display use, for example, when it is not disposed on the side of an observer, the transparency is not always required. Accordingly, in such case, an opaque material can also be used as the plastic film. Examples of the opaque material include known liquid crystal polymers such as polyimides and polyacrylonitrile.

The thickness of the plastic film to be used for the gas barrier film of the invention is properly chosen depending upon the use and therefore, is not particularly limited. It is typically from 1 to 800 μm, and preferably from 10 to 200 μm. These plastic films may have a functional layer such as a transparent conductive layer and a primer layer. The functional layer is described in detail in paragraphs 0036 to 0038 of JP-A-2006-289627. Examples of functional layers other than these layers include a matting agent layer, a passivation layer, an antistatic layer, a smoothening layer, an adhesion improving layer, a light shielding layer, an antireflection layer, a hard coat layer, a stress relaxing layer, an antifogging layer, an antifouling layer, a layer to be printed and an easily adhesive layer.

(Organic Layer)

In the invention, the organic layer is a layer of a polymer compound such as acrylic resin, methacrylic resin, polyester, methacrylic acid/maleic acid copolymer, polystyrene, transparent fluororesin, polyimide, fluoropolyimide, polyamide, polyamidimide, polyetherimide, cellulose acylate, polyurethane, polyether ketone, polycarbonate, alicyclic polyolefin, polyarylate, polyether sulfone, polysulfone, fluorene ring-modified polycarbonate, alicyclic-modified polycarbonate or fluorene ring-modified polyester. The polymer compound for the organic layer is preferably an acrylic resin or a methacrylic resin comprising a polymer of an acrylate and/or methacrylate monomer as the main ingredient thereof. In the invention, the polymer of a monomer mixture may be prepared by polymerizing the monomer mixture. In the invention, the constitution of the monomer mixture is preferably as follows. The monomer mixture in the invention comprises from 75 to 95% by mass of a bifunctional or trifunctional acrylate or methacrylate monomer (main monomer) and from 5 to 25% by mass of a tetrafunctional or more polyfunctional acrylate or methacrylate monomer (polyfunctional monomer). The monomer mixture may contain a monofunctional acrylate or methacrylate monomer (monofunctional monomer) in an amount of at most 20% by mass.

The main monomer and the polyfunctional monomer in the invention may be a single monomer or a mixture of plural monomers. In case where the monomer mixture contains a monofunctional monomer, the monofunctional monomer may be a single monomer or a mixture of plural monomers.

The monomer preferred for use in the invention is a monomer represented by the following general formula (2):

$$(Ac-O)_n\text{-L} \quad (2)$$

In formula (2), Ac represents an acryloyl group or a methacryloyl group; O represents an oxygen atom; L represents a divalent or trivalent linking group having from 3 to 18 carbon atoms in total; and n indicates 2 or 3.

The divalent linking group having from 3 to 18 carbon atoms for L includes an alkylene group (e.g., 1,3-propylene, 2,2-dimethyl-1,3-propylene, 2-butyl-2-ethyl-1,3-propylene, 1,6-hexylene, 1,9-nonylene, 1,12-dodecylene, 1,16-hexadecylene); a bisphenol skeleton-having group; and a divalent group formed by bonding in series at least two group selected from the group consisting of an alkylene group, a bisphenol skeleton-having group, an ether group, an imino group, a carbonyl group and a bisphenol skeleton-having group (e.g., polyethyleneoxy, polypropyleneoxy, propionyloxyethylene, butyloyloxypropylene, caproyloxyethylene, caproyloxybutylene).

L may have a substituent. Examples of the substituent for L include an alkyl group (e.g., methyl group, ethyl group, butyl group), an aryl group (e.g., phenyl group), an amino group (e.g., amino group, methylamino group, dimethylamino group, diethylamino group), an alkoxy group (e.g., methoxy group, ethoxy group, butoxy group, 2-ethylhexyloxy group), an acyl group (e.g., acetyl group, benzoyl group, formyl group, pivaloyl group), an alkoxycarbonyl group (e.g., methoxycarbonyl group, ethoxycarbonyl group), a hydroxyl group, a halogen atom (e.g., fluorine, chlorine, bromine, iodine), a cyano group, etc. As the substituent, preferred are an alkyl group and an alkoxy group.

The trivalent linking group having from 3 to 18 carbon atoms for L includes a trivalent residue derived from the above-mentioned divalent linking group by removing one hydrogen atom from it, and a trivalent residue derived from the above-mentioned divalent linking group by removing one hydrogen atom from it and substituting the hydrogen-removed site thereof with an alkylene group, an ether group, a carbonyl group or a divalent group of a plurality of those groups bonding to each other in series.

Specific examples of the main monomer of formula (2) are shown below, to which, however, the invention should not be limited.

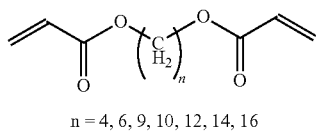

n = 4, 6, 9, 10, 12, 14, 16

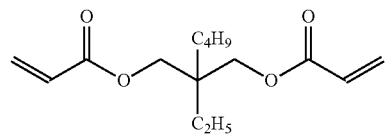

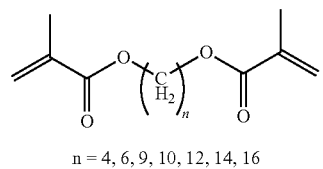

n = 4, 6, 9, 10, 12, 14, 16

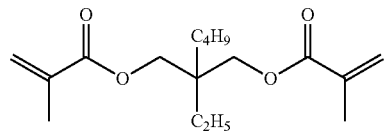

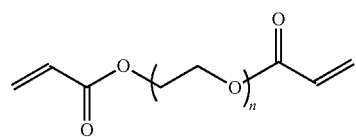

n = 2, 3, 4, 5

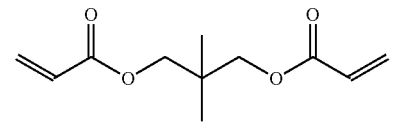

-continued
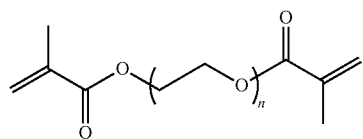 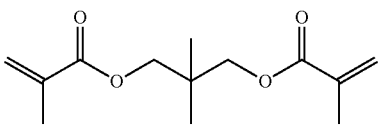
n = 2, 3, 4, 5
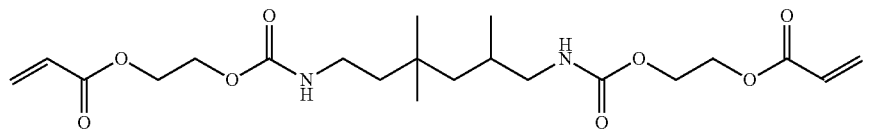
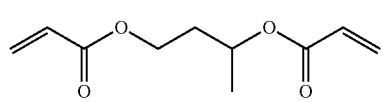 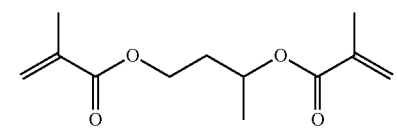 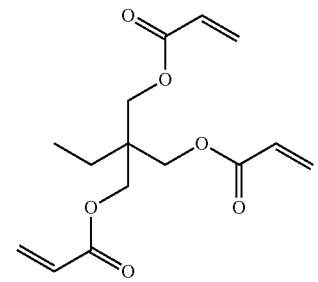
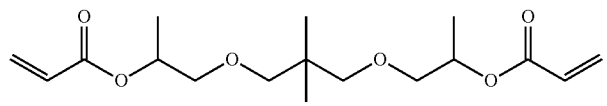
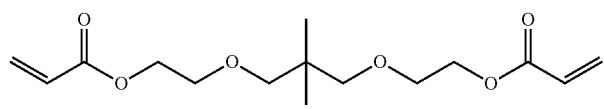
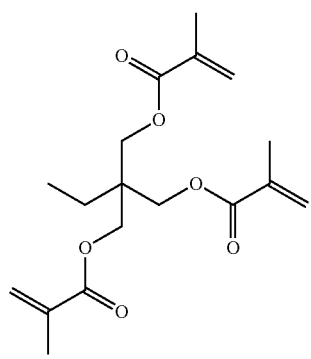
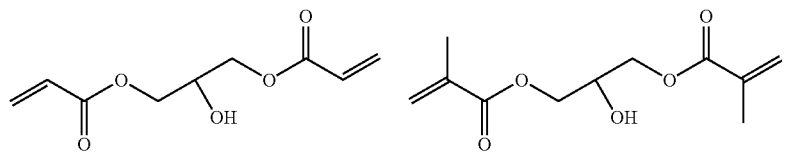
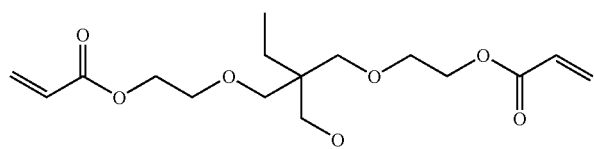
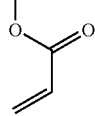

-continued

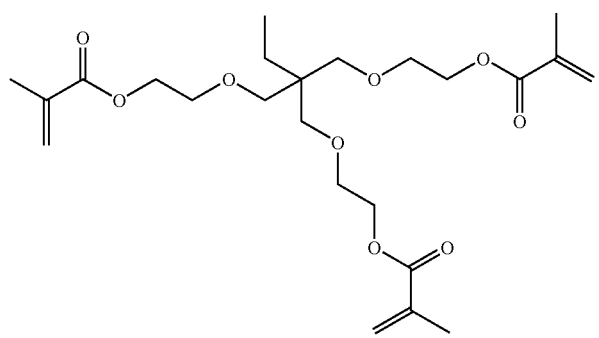

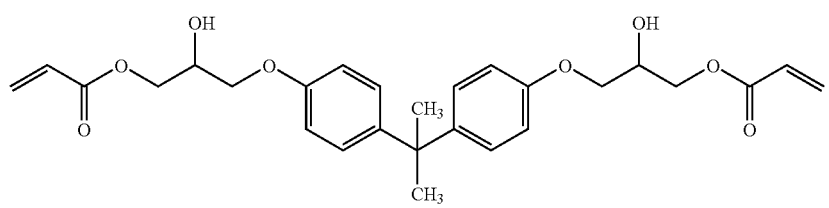

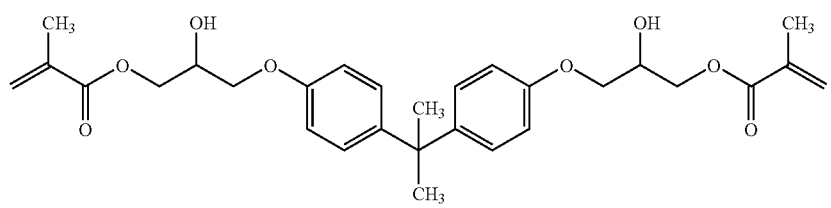

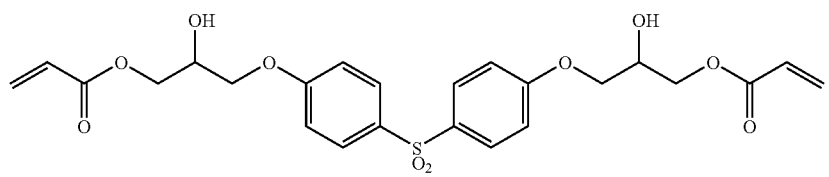

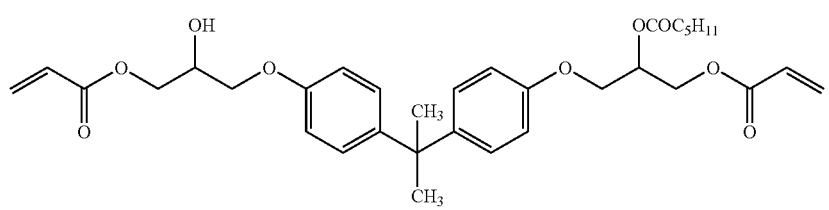

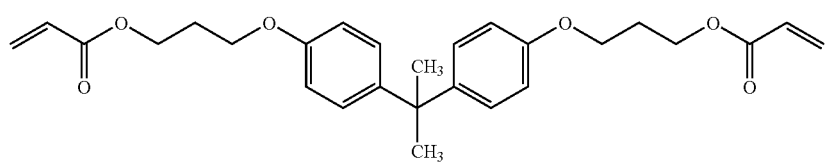

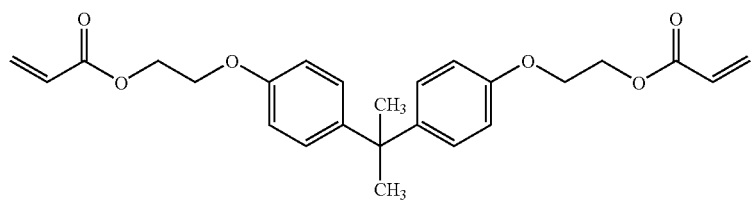

The polyfunctional monomer which can be used in the invention is not particularly limited so far as it is a tetrafunctional or polyfunctional acrylate or methacrylate monomer and is typically a tetravalent to hexavalent acrylate or methacrylate monomer. Examples of a preferable skeleton include a pentaerythritol skeleton and a dipentaerythritol skeleton.

Specific examples of the polyfunctional monomer which can be preferably used in the invention are given below, but it should not be construed that the polyfunctional monomer which can be used in the invention is limited thereto.
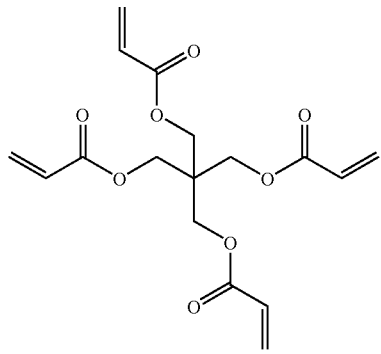
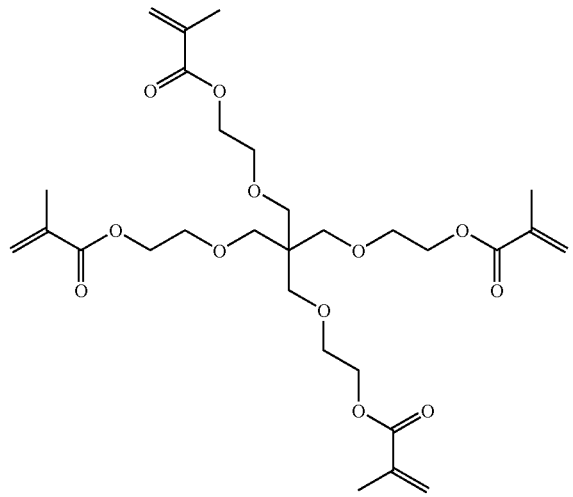
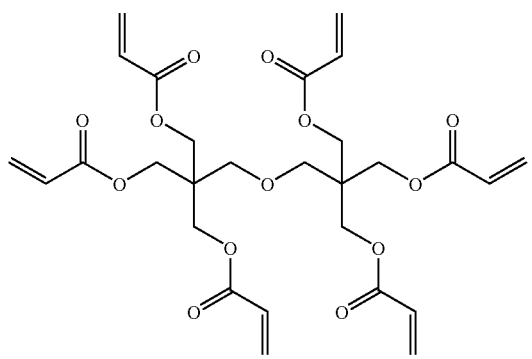
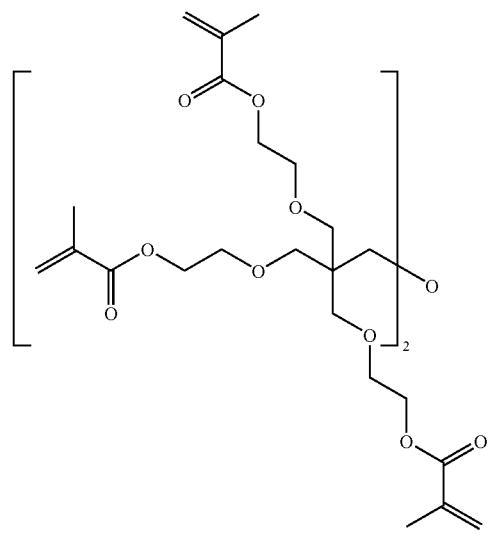
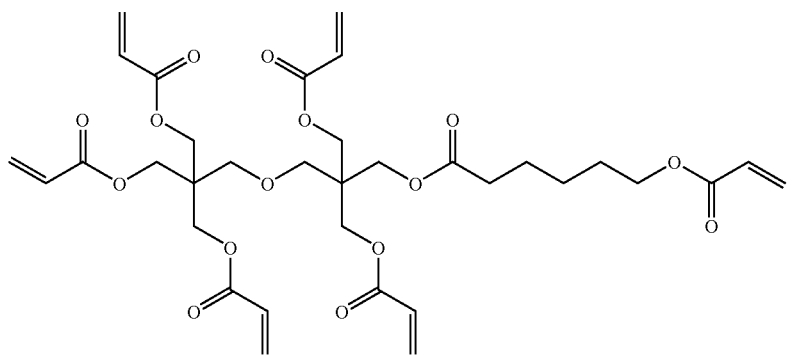

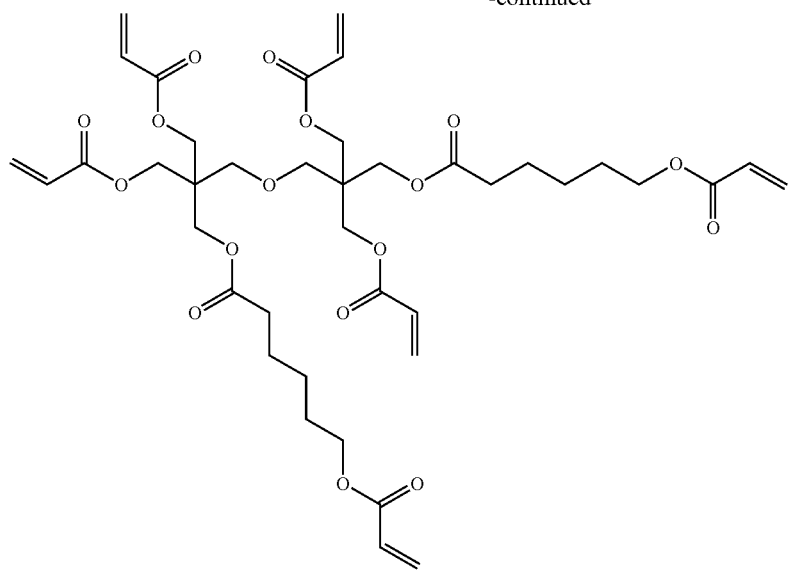
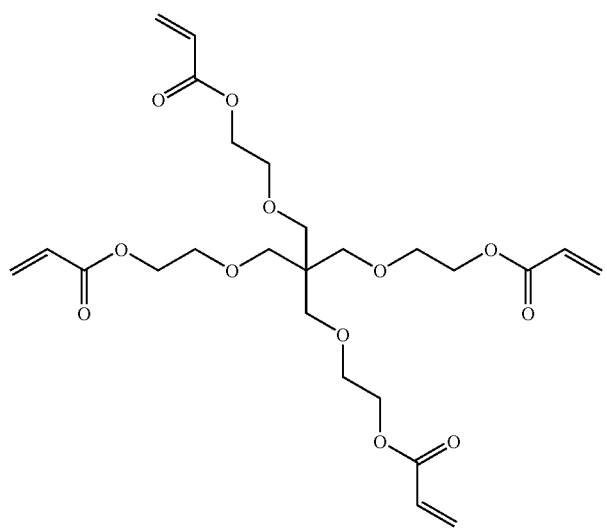
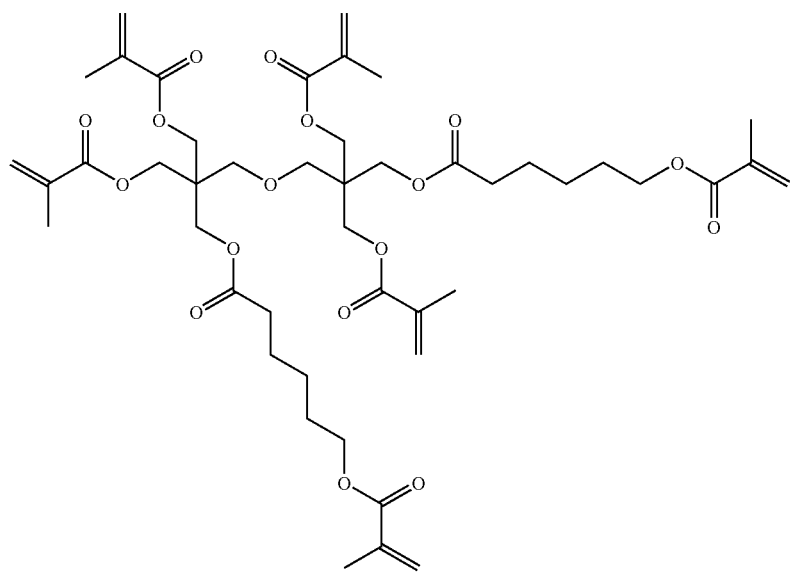

-continued

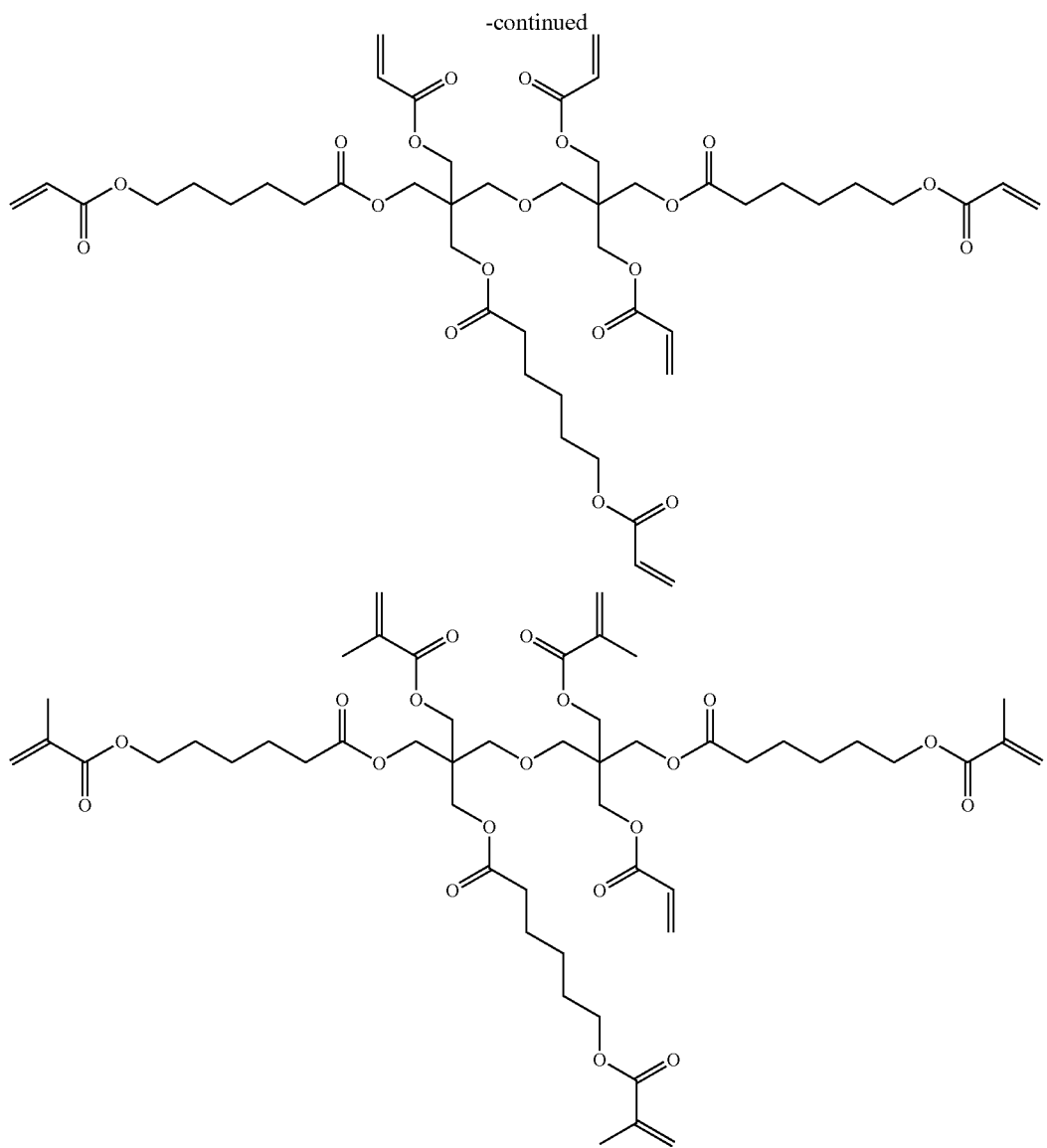

The monofunctional monomer which can be used in the invention is not particularly limited so far as it is an acrylate or methacrylate monomer and is typically an acrylate or methacrylate monomer having a molecular weight of from 150 to 600. Specific examples of the monofunctional monomer which can be used in the invention are given below, but it should not be construed that the monofunctional monomer which can be used in the invention is limited thereto.

-continued

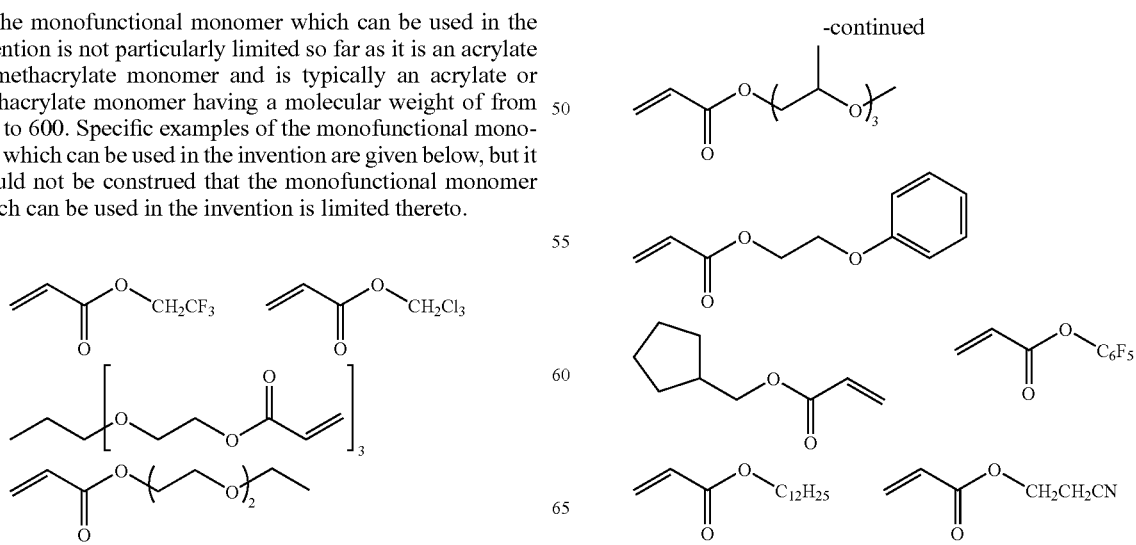

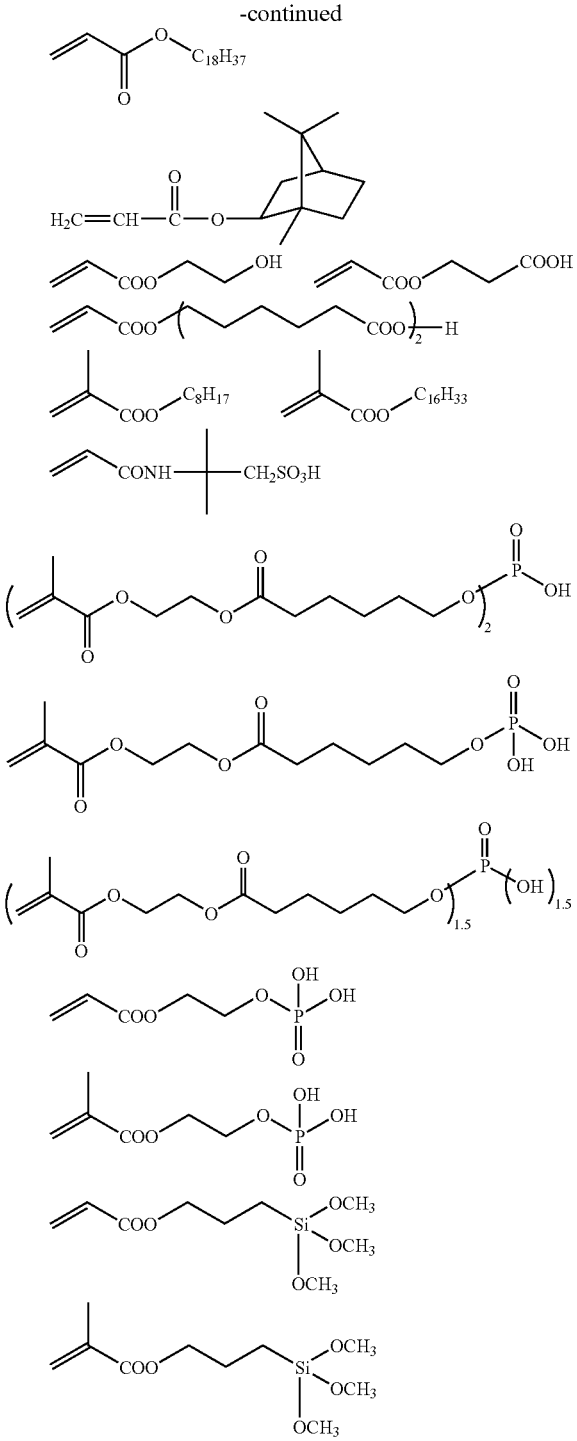

Examples of the formation method of the organic layer include usual solution coating method and vacuum fabrication method. As the solution coating method, the solution can be coated by, for example, a dip coating method, an air knife coating method, a curtain coating method, a roller coating method, a wire bar coating method, a gravure coating method, a slide coating method or an extrusion coating method using a hopper described in U.S. Pat. No. 2,681,294. Though the vacuum fabrication method is not particularly limited, a flash vapor deposition method described in U.S. Pat. Nos. 4,842,893, 4,954,371 and 5,032,461 is preferable.

Though the monomer polymerization method is not particularly limited, heat polymerization, photo (ultraviolet ray or visible light) polymerization, electron beam polymerization, plasma polymerization or a combination thereof is preferably employed. Of these, photopolymerization is especially preferable. In the case where photopolymerization is carried out, a photopolymerization initiator is used in combination. Examples of the photopolymerization initiator include IRGACURE series (for example, IRGACURE 651, IRGACURE 754, IRGACURE 184, IRGACURE 2959, IRGACURE 907, IRGACURE 369, IRGACURE 379 AND IRGACURE 819), DAROCURE series (for example, DAROCURE TPO and DAROCURE 1173) and QAUNTACURE PDO, all of which are marketed by Ciba Specialty Chemicals; and EZACURE series (for example, EZACURE TZM and EZACURE TZT) which are marketed by Sartomer Company.

The light to be irradiated is usually an ultraviolet ray to be emitted from a high pressure mercury vapor lamp or a low pressure mercury vapor lamp. The irradiation energy is preferably 0.5 j/cm$^2$ or more, and more preferably 2 J/cm$^2$ or more. Since the acrylate or methacrylate is affected by polymerization inhibition due to oxygen in air, it is preferable to reduce the oxygen concentration or oxygen partial pressure at the time of polymerization. In the case of reducing the oxygen concentration at the time of polymerization by a nitrogen purge method, the oxygen concentration is preferably not more than 2%, and more preferably not more than 0.5%. In the case of reducing the oxygen partial pressure at the time of polymerization by a pressure reducing method, the total pressure is preferably not more than 1,000 Pa, and more preferably not more than 100 Pa. Also, it is especially preferable to carry out ultraviolet ray polymerization upon irradiation with energy of 2 J/cm$^2$ or more under a reduced pressure condition of not more than 100 Pa.

The thickness of the organic layer is not particularly limited. When the thickness of the organic layer is too thin, uniformity of the thickness is hardly obtained, whereas when it is too thick, the amount of water invading through the sides is increased, thereby causing a reduction of the barrier properties. From such a viewpoint, the thickness of the foregoing adjacent organic layer is preferably from 50 nm to 2,000 nm, and more preferably from 200 nm to 1,500 nm.

It is desirable that the thus disposed organic layer is smooth. As to the smoothness of the organic layer, its Ra value measured by AFM is preferably not more than 10 nm, more preferably not more than 5 nm, and especially preferably not more than 2 nm.

Preferably, organic layers are provided directly on both sides of an inorganic layer, whereby an gas-barrier film capable of maintaining its barrier properties after bending is provided.

<<Organic Device>>

The organic device of the invention refers to, for example, an image display device (for example, circularly polarizing plates, liquid crystal display devices, electronic papers and organic EL devices (organic electroluminescent device)), a dye-sensitized solar cell or a touch panel. Though the use of the gas barrier film of the invention is not particularly limited, it can be favorably used as a substrate or sealing film of the organic device.

<Circularly Polarizing Plate>

The circularly polarizing plate can be prepared by stacking laminating a λ/4 plate and a polarizing plate on the gas barrier film of the invention. In that case, the both plates are stacked laminated in such a manner that a slow axis of the λ/4 plate and an absorption axis of the polarizing plate form 45°. As such a polarizing plate, one stretched in a direction of 450 against the machine direction (MD) thereof is preferably used, and those described in, for example, JP-A-2002-865554 can be favorably used.

<Liquid Crystal Display Device>

The liquid crystal display device can be roughly classified into a reflection type liquid crystal display device and a transmission type liquid crystal display device. The reflection type liquid crystal display device is configured to include a lower substrate, a reflection electrode, a lower alignment film, a liquid crystal layer, an upper alignment film, a transparent electrode, an upper substrate, a λ/4 plate and a polarizing film in order from the lower side. The gas barrier film of the invention can be used as the transparent electrode and the upper substrate. In the case of giving a color displaying function to the reflection type liquid crystal display device, it is preferable to further provide a color filter layer between the reflection electrode and the lower alignment film or between the upper alignment film and the transparent electrode.

Also, the transmission type liquid crystal display device is configured to include a backlight, a polarizing plate, a λ/4 plate, a lower transparent electrode, a lower alignment film, a liquid crystal layer, an upper alignment film, an upper transparent electrode, an upper substrate, a λ/4 plate and a polarizing plate in order from the lower side. Of these, the gas barrier film of the invention can be used as the upper transparent electrode and the upper substrate. Also, in the case of giving a color displaying function to the transmission type liquid crystal display device, it is preferable to further provide a color filter layer between the lower transparent electrode and the lower alignment film or between the upper alignment film and the upper transparent electrode.

Though the structure of the liquid crystal layer is not particularly limited, it is preferably of, for example, a TN (twisted nematic) type, an STN (super twisted nematic) type, an HAN (hybrid aligned nematic) type, a VA (vertically alignment) type, an ECB (electrically controlled birefringence) type, an OCB (optically compensated bend) type, a CPA (continuous pinwheel alignment) type or an IPS (in-plane switching) type.

<Touch Panel>

As the touch panel, one obtained by applying the gas barrier film of the invention onto a substrate described in, for example, JP-A-5-127822 or JP-A-2002-48913 can be used.

<Organic EL Device>

The organic EL device of the invention has a cathode and an anode on a substrate and has an organic compound layer including an organic light-emitting layer (hereinafter often referred to simply as "light-emitting layer") between the both electrodes. In view of properties of the light-emitting device, it is preferable that at least one electrode of the anode and the cathode is transparent.

In the invention, an embodiment of the stacklaminate of the organic compound layer is preferably an embodiment in which a hole transport layer, a light-emitting layer and an electron transport layer are stackedlaminated in order from the anode side. Furthermore, a charge blocking layer may be provided between the hole transport layer and the light-emitting layer or between the light-emitting layer and the electron transport layer. A hole injection layer may be provided between the anode and the hole transport layer; and an electron injection layer may be provided between the cathode and the electron transport layer. Each of the layers may be divided into plural secondary layers.

(Anode)

In general, the anode may have a function as an electrode capable of supplying a hole into the organic compound layer and is not particularly limited as to its shape, structure and size or the like. The anode can be properly chosen among known electrode materials depending upon the use and purpose of the light-emitting device. As described previously, the anode is usually provided as a transparent anode.

As materials of the anode, for example, metals, alloys, metal oxides, conductive compounds or mixtures thereof can be favorably exemplified. Specific examples of anode materials include conductive metal oxides such as tin oxides doped with antimony, fluorine, etc. (for example, ATO and FTO), tin oxide, zinc oxide, indium oxide, indium tin oxide (ITO) and indium zinc oxide (IZO); metals such as gold, silver, chromium and nickel; mixtures or stacklaminates of these metals and conductive metal oxides; inorganic conductive substances such as copper iodide and copper sulfide; organic conductive materials such as polyaniline, polythiophene and polypyrrole; and stacklaminates thereof with ITO. Of these, conductive metal oxides are preferable; and ITO is especially preferable in view of productivity, high conductivity, transparency and the like.

The anode can be formed on the substrate according to a method to be properly chosen while taking into consideration adaptability with the material constituting the anode among wet modes (for example, a printing mode and a coating mode), physical modes (for example, a vacuum vapor deposition method, a sputtering method and an ion plating method) and chemical modes (for example, CVD and plasma CVD). For example, in the case where ITO is chosen as the anode material, the anode can be formed according to a direct current or high frequency sputtering method, a vacuum vapor deposition method, an ion plating method or the like.

In the organic EL device of the invention, the position at which the anode is formed is not particularly limited and can be properly chosen depending upon the use and purpose of the light-emitting device. However, the anode is preferably formed on the substrate. In that case, the anode may be formed on the entirety of one of the surfaces of the substrate or may be formed on a part thereof. In forming the anode, patterning may be achieved through chemical etching by photolithography, etc., may be achieved through physical etching by a laser, etc., may be achieved through vacuum vapor deposition by superimposing a mask, sputtering or the like, or may be achieved by a lift-off method or a printing method. The thickness of the anode can be properly chosen depending upon the material constituting the anode and cannot be unequivocally defined. However, the thickness of the anode is in general from about 10 nm to 50 μm, and preferably from 50 nm to 20 μm.

The resistivity value of the anode is preferably not more than $10^3 \Omega/\square$, and more preferably not more than $10^2 \Omega/\square$. In the case where the anode is transparent, it may be colorless transparent or may be colored transparent. In order to take out light emission from the transparent anode side, its transmittance is preferably 60% or more, and more preferably 70% or more. The transparent anode is described in detail in *New Developments of Transparent Conducting Films*, supervised By SAWADA, Yutaka (published by CMC Publishing Co., Ltd., 1999), and the matters described therein can be applied in the invention. In the case of using a plastic base material with low heat resistance, a transparent anode obtained through fabrication at a low temperature of not higher than 150° C. using ITO or IZO is preferable.

(Cathode)

In general, the cathode may have a function as an electrode capable of injecting an electron into the organic compound layer and is not particularly limited as to its shape, structure and size or the like. The cathode can be properly chosen among known electrode materials depending upon the use and purpose of the light-emitting device. As materials constituting the cathode, for example, metals, alloys, metal oxides, electric conductive materials or mixtures thereof can be exemplified. Specific examples thereof include alkali metals (for example, Li, Na, K and Ca), alkaline earth metals (for example, Mg and Ca), gold, silver, lead, aluminum, a sodium-potassium alloy, a lithium-aluminum alloy, a magnesium-silver alloy, indium and rare earth metals (for example, ytterbium). Though these materials may be used singly, from the standpoint of making stability and electron injection properties compatible with each other, two or more kinds of these materials can be favorably used in combination.

Of these, in view of electron injection properties, the material constituting the cathode is preferably an alkali metal or an alkaline earth metal; and in view of excellent storage stability, the material constituting the cathode is preferably a material composed mainly of aluminum.

The material composed mainly of aluminum refers to aluminum alone or an alloy of aluminum and from 0.01 to 10% by mass of an alkali metal or an alkaline earth metal or a mixture thereof (for example, a lithium-aluminum alloy and a magnesium-aluminum alloy). The cathode material is described in detail in JP-A-2-15595 and JP-A-5-121172, and materials described in these patent documents can also be applied in the invention.

The cathode can be formed according to a known method without particular limitations. For example, the cathode can be formed according to a method to be properly chosen while taking into consideration adaptability with the material constituting the cathode among wet modes (for example, a printing node and a coating mode), physical modes (for example, a vacuum vapor deposition method, a sputtering method and an ion plating method) and chemical modes (for example, CVD and plasma CVD). For example, in the case where a metal or the like is chosen as the cathode material, one or two or more kinds of metals can be subjected to sputtering simultaneously or successively. In forming the cathode, patterning may be achieved through chemical etching by photolithography, etc., may be achieved through physical etching by a laser, etc., may be achieved through vacuum vapor deposition by superimposing a mask, sputtering or the like, or may be achieved by a lift-off method or a printing method.

In the invention, the position at which the cathode is formed is not particularly limited, and the cathode may be formed on the entirety of the organic compound layer or may be formed on a part thereof. Also, a dielectric layer composed of a fluoride or oxide of an alkali metal or alkaline earth metal or the like may be inserted in a thickness of from 0.1 to 5 nm between the cathode and the organic compound layer. This dielectric layer can be considered as a certain kind of the electron injection layer. The dielectric layer can be formed by, for example, a vacuum vapor deposition method, a sputtering method or an ion plating method. The thickness of the cathode can be properly chosen depending upon the material constituting the cathode and cannot be unequivocally defined. However, the thickness of the cathode is in general from about 10 nm to 5 μm, and preferably from 50 nm to 1 μm.

Also, the cathode may be transparent or opaque. The transparent cathode can be formed by thinly fabricating the cathode material in a thickness of from 1 to 10 nm and further stacking laminating a transparent conductive material such as ITO and IZO thereon.

(Organic Compound Layer)

The organic compound layer in the invention is hereunder described.

The organic EL device of the invention has at least one organic compound layer including a light-emitting layer. As described previously, examples of other organic compound layers than the organic light-emitting layer include respective layers such as a hole transport layer, an electron transport layer, a charge blocking layer, a hole injection layer and an electron injection layer.

((Formation of Organic Compound Layer))

In the organic EL device of the invention, each of the layers constituting the organic compound layer can be favorably formed by any of a dry type fabrication method (for example, a vapor deposition method and a sputtering method), a transfer method, a printing method or the like.

((Organic Light-Emitting Layer))

The organic light-emitting layer is a layer having a function such that at the time of application of an electric field, it receives a hole from the anode, the hole injection layer or the hole transport layer and receives an electron from the cathode, the electron injection layer or the electron transport layer to provide a field of recombination of the hole and the electron, thereby achieving light emission. In the invention, the light-emitting layer may be constituted of only a light-emitting material or may be configured as a mixed layer of a host material and a light-emitting material. The light-emitting material may be a fluorescent light-emitting material or a phosphorescent light-emitting material; and a dopant may be a single material or a combination of two or more kinds of materials. The host material is preferably a charge transport material. The host material may be a single material or a combination of two or more kinds of materials, and examples thereof include a constitution of a mixture of an electron transporting host material and a hole transporting host material. Furthermore, the light-emitting layer may contain a material which does not have charge transporting properties and does not emit light. Also, the light-emitting layer may be a single layer or may be configured of two or more layers, and the respective layers may emit light in a different luminescent color.

Examples of the fluorescent light-emitting material which can be used in the invention include compounds, for example, benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perynone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, various metal complexes represented by metal complexes of 8-quinolinol derivatives and pyrromethene derivatives, polymer compounds (for example, polythiophene, polyphenylene and polyphenylenevinylene) and organosilane derivatives.

Also, examples of the phosphorescent light-emitting material which can be used in the invention include complexes containing a transition metal atom or a lanthanoid atom. The transition metal atom is not particularly limited, and preferred examples thereof include ruthenium, rhodium, palladium, tungsten, rhenium, osmium, iridium and platinum, with rhenium, iridium and platinum being more preferable. Examples of the lanthanoid atom include lanthanum, cerium, praseodymium, neodymium, samarium, europium, gadolinium, terbium, dysprosium, holmium, erbium, thulium, ytterbium and lutetium. Of these lanthanoid atoms, neodymium, europium and gadolinium are preferable.

Examples of a ligand of the complex include ligands described in G. Wilkinson, et al., *Comprehensive Coordination Chemistry*, published by Pergamon Press, 1987; H. Yersin, *Photochemistry and Photophysics of Coordination Compounds*, published by Springer-Verlag, 1987; and YAMAMOTO, Akio, *Organometallic Chemistry—Principles and Applications*, published by Shokabo Publishing Co., Ltd., 1982. Specifically, as the ligand, halogen ligands (preferably a chlorine ligand), nitrogen-containing heterocyclic ligands (for example, phenylpyridine, benzoquinoline, quinolinol, bipyridyl and phenanthroline), diketone ligands (for example, acetylacetone), carboxylic acid ligands (for example, an acetic acid ligand), a carbon monoxide ligand, an isonitrile ligand and a cyano ligand are preferable, with nitrogen-containing heterocyclic ligands being more preferable. The complex may contain one transition metal atom in the compound thereof or may be a so-called polynuclear complex containing two or more transition metal atoms therein. The complex may contain metal atoms of a different kind at the same time.

The phosphorescent light-emitting material is preferably contained in an amount of from 0.1 to 40% by mass, and more preferably from 0.5 to 20% by mass in the light-emitting layer. Also, examples of the host material which is contained in the light-emitting layer in the invention include materials as enumerated in the following paragraphs of hole injection layer, hole transport layer, electron injection layer and electron transport layer as well as a material having a carbazole skeleton, a material having a diarylamine skeleton, a material having a pyridine skeleton, a material having a pyrazine skeleton, a material having a triazine skeleton and a material having an arylsilane skeleton. The thickness of the light-emitting layer is not particularly limited. However, in general, the thickness of the light-emitting layer is preferably from 1 nm to 500 nm, more preferably from 5 nm to 200 nm, and further preferably from 10 nm to 100 nm.

((Hole Injection Layer and Hole Transport Layer))

The hole injection layer and the hole transport layer are each a layer having a function to receive a hole from the anode or the anode side to transport it into the cathode side. Specifically, the hole injection layer and the hole transport layer are each preferably a layer containing a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene based compound, a porphyrin based compound, an organosilane derivative, carbon or the like. The thickness of each of the hole injection layer and the hole transport layer is preferably not more than 500 nm from the viewpoint of the reducing driving voltage.

The thickness of the hole transport layer is preferably from 1 nm to 500 nm, more preferably from 5 nm to 200 nm, and further preferably from 10 nm to 100 nm. Also, the thickness of the hole injection layer is preferably from 0.1 nm to 200 nm, more preferably from 0.5 nm to 100 nm and further preferably from 1 nm to 100 nm. Each of the hole injection layer and the hole transport layer may be of a single-layered structure composed of one or two or more kinds of the foregoing materials or may be of a multilayered structure composed of plural layers of the same composition or a different composition.

((Electron Injection Layer and Electron Transport Layer))

The electron injection layer and the electron transport layer are each a layer having a function to receive an electron from the cathode or the cathode side to transport it into the anode side. Specifically, the electron injection layer and the electron transport layer are each preferably a layer containing a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, aromatic ring tetracarboxylic acid anhydrides of naphthalene, perylene, etc., a phthalocyanine derivative, a metal complex of every kind represented by metal complexes of 8-quinolinol derivatives and metal complexes composed of, as a ligand, metal phthalocyanine, benzoxazole or benzothiazole, anorganosilane derivative or the like.

The thickness of each of the electron injection layer and the electron transport layer is preferably not more than 500 nm from the viewpoint of reducing the driving voltage. The thickness of the electron transport layer is preferably from 1 nm to 500 nm, more preferably from 5 nm to 200 nm, and further preferably from 10 nm to 100 nm. Also, the thickness of the electron injection layer is preferably from 0.1 nm to 200 nm, more preferably from 0.2 nm to 100 nm, and further preferably from 0.5 nm to 50 nm. Each of the electron injection layer and the electron transport layer may be of a single-layered structure composed of one or two or more kinds of the foregoing materials or may be of a multilayered structure composed of plural layers of the same composition or a different composition.

((Hole Blocking Layer))

The hole blocking layer is a layer having a function to prevent a phenomenon in which the hole which has been transported into the light-emitting layer from the anode side passes through into the cathode side from occurring. In the invention, the hole blocking layer can be provided as an organic compound layer which is positioned adjacent to the light-emitting layer on the cathode side. Examples of an organic compound constituting the hole blocking layer include aluminum complexes such as BAlq, triazole derivatives and phenanthroline derivatives such as BCP. The thickness of the hole blocking layer is preferably from 1 nm to 500 nm, more preferably from 5 nm to 200 nm, and further preferably from 10 nm to 100 nm. The hole blocking layer may be of a single-layered structure composed of one or two or more kinds of the foregoing materials or may be of a multilayered structure composed of plural layers of the same composition or a different composition.

(Passivation Layer)

In the invention, the whole of the organic EL device may be passivated by a passivation layer.

As a material to be contained in the passivation layer, a material having a flattening action and a material having a function to inhibit the matter that moisture and oxygen come into the device are preferable. Specific examples thereof include metals such as In, Sn, Pb, Au, Cu, Ag, Al, Ti and Ni; metal oxides such as MgO, SiO, $SiO_2$, $Al_2O_3$, GeO, NiC, CaO, BaO, $Fe_2O_3$, $Y_2O_3$ and $TiO_2$; metal nitrides such as $SiN_x$; metal oxynitrides such as $SiN_xO_y$; metal fluorides such as $MgF_2$, LiF, $AlF_3$ and $CaF_2$; polyethylene; polypropylene; polymethyl methacrylate; polyimides; polyureas; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers having a cyclic structure in the copolymer principal chain; water-absorbing substances having a coefficient of water absorption of 1% or more; and moisture-proof substances having a coefficient of water absorption of not more than 0.1%. Of these, oxides, nitrides and oxynitrides of a metal are preferable; and oxides, nitrides and oxynitrides of silicon are especially preferable.

The formation method of the passivation layer is not particularly limited, and examples thereof include a vacuum vapor deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a vacuum ultraviolet CVD method, a coating method, a printing method and a transfer method. In the invention, the passivation layer may also be used as a conductive layer.

(Sealing)

Furthermore, in the organic EL device of the invention, the whole of the device may be sealed by using a sealing container. Also, a moisture absorber or an inert liquid may be enclosed in a space between the sealing container and the light-emitting device. The moisture absorber is not particularly limited. Examples of the moisture absorber which can be used include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide. The inert liquid is not particularly limited, and examples thereof include paraffins, liquid paraffins, fluorine based solvents such as perfluoroalkanes, perfluoroamines and perfluoroethers, chlorine based solvents and silicone oils.

As another sealing method, a so-called solid sealing method may be employed, too. The solid sealing method is a method in which after forming the passivation layer on the organic EL device, an adhesive layer and a support layer with barrier properties are superimposed thereon, followed by curing. The adhesive is not particularly limited, and examples thereof include thermosetting epoxy resins and photocurable acrylate resins. The support with barrier properties may be glass or may be the gas barrier film of the invention.

Furthermore, as another sealing method, a so-called film sealing method may be employed, too. The film sealing method is a method in which an alternate stacklaminate of an inorganic layer and an organic layer is provided on the organic EL device. The organic EL device may be covered by the passivation layer prior to providing the alternate stacklaminate.

In the organic EL device of the invention, the light emission can be obtained by applying a direct current (may contain an alternate current component as the need arises) voltage (usually from 2 volts to 15 volts) or a direct current between the anode and the cathode. As to the driving method of the organic EL device of the invention, driving methods described in, for example, JP-A-2-148687, JP-A-6-301355, JP-A-5-29080, JP-A-7-134558, JP-A-8-234685, JP-A-8-241047, Japanese Patent No. 2784615 and U.S. Pat. Nos. 5,828,429 and 6,023,308 can be applied.

<Solar Cell>

The gas barrier film of the invention can be used also as a sealing film for solar cell devices. Preferably, the gas barrier film of the invention is used for sealing a solar cell device in such a manner that its adhesive layer is on the side near to the solar cell device. The solar cell devices for which the gas barrier film of the invention is favorably used are not specifically defined. For example, they include single crystal silicon-based solar cell devices, polycrystalline silicon-based solar cell devices, single-junction or tandem-structure amorphous silicon-based solar cell devices, gallium-arsenic (GaAs), indium-phosphorus (InP) or the like III-V Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-II-VI Group compound semiconductor-based solar cell devices, dye-sensitized solar cell devices, organic solar cell devices, etc. Above all, in the invention, the solar cell devices are preferably copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices.

EXAMPLES

The characteristic features of the invention are hereunder described in more detail with reference to the following Examples. Materials, use amounts, proportions, treatment contents, treatment procedures and the like shown in the following Examples can be properly changed so far as the gist of the invention is not deviated. Accordingly, the scope of the invention should not be limitedly construed by the following specific examples.

Example 1

Production and Evaluation of Gas-Barrier Film

A gas-barrier film having a layer constitution shown in FIG. 1 was produced. In FIG. 1, 1 is a polyethylene naphthalate film, 2 is an organic layer, 3-1 and 3-2 each are a silicon nitride layer, 4 is a silicon hydronitride layer.

(1) Preparation of Support

A polyethylene naphthalate film (PEN film, Teijin-DuPont's trade name, Neotex Q65FA) was prepared as a support. An organic layer was formed on one surface of the support, according to the following process.

(2) Formation of Organic Layer

An organic layer coating liquid having the composition mentioned below was applied onto one surface of the support, according to a bar coating method. The coating amount was 5 cc/m$^2$, and in a chamber in which the oxygen concentration was reduced to at most 0.1% according to a nitrogen purging method, this was irradiated with ultraviolet rays from a high-pressure mercury lamp (integrated irradiation dose, about 2 J/cm$^2$), whereby the coating layer was cured to be an organic layer.

| <Coating Liquid for organic layer> | |
|---|---|
| Acrylate monomer, BEPGA | 20 g |
| UV polymerization initiator, Irgacure 907 (by Ciba Specialties) | 0.6 g |
| 2-Butanone | 190 g |

The film thickness was 500 nm±50 nm.

(3) Formation of Inorganic Layer

On the surface of the inorganic layer formed in the above, inorganic layers (silicon nitride layer, silicon hydronitride layer, silicon nitride layer in that order) were formed according to a plasma CVD method.

The substrate coated with the organic layer was set in a reaction chamber, and a starting gas of plasma-CVD starting gas formulation 1 described below was introduced thereinto under reduced pressure. A high-frequency power of 13.56 MHz was given to it for a predetermined period of time for plasma generation, and a silicon nitride layer (except Si, N ingredient content: 97 mol %) was thereby formed. The film formation was so controlled that the thickness of the formed film could be 50 nm. Next, another starting gas of plasma-CVD starting gas formulation 2 described below was introduced into the chamber, and a silicon hydronitride layer (except Si, N ingredient content: 36 mol %, H ingredient content: 63 mol %) was thereby formed. The film formation was so controlled that the thickness of the formed film could be 100 nm. Further again, the starting gas of plasma-CVD starting gas formulation 1 described below was introduced into the chamber, and a silicon nitride layer (except Si, N ingredient content: 97 mol %) was thereby formed. The film formation was so controlled that the thickness of the formed film could be 50 nm. In every film formation, the plasma was once stopped.

In this Example, the total thickness of the inorganic layers was 200 nm±10 nm.

| <Plasma-CVD starting gas formulation 1> | |
|---|---|
| Silane gas | 25 sccm, |
| Ammonia gas | 15 sccm, |
| Nitrogen gas | 200 sccm. |
| <Plasma-CVD starting gas formulation 2> | |
| Silane gas | 25 sccm, |
| Ammonia gas | 50 sccm, |
| Nitrogen gas | 165 sccm. |

Example 2

Figure 2:
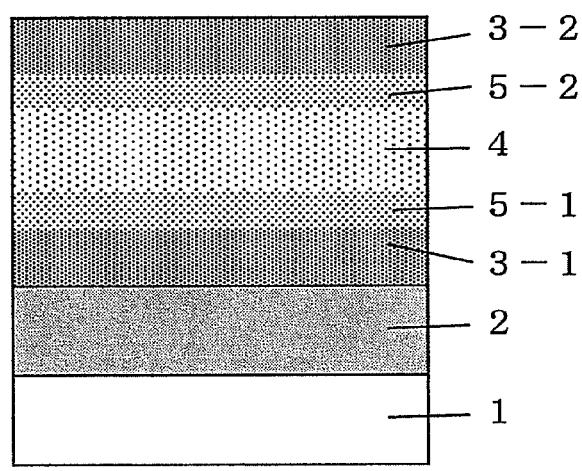
FIG. 2 shows the layer constitution of the gas-barrier film produced in Example 2.

A gas-barrier film having a layer constitution shown in FIG. 2 was produced. In FIG. 2, 1 is a polyethylene naphthalate film, 2 is an organic layer, 3-1 and 3-2 each are a silicon nitride layer, 4 is a silicon hydronitride layer, 5-1 and 5-2 each are a hydrogen composition-changing layer formed during changing of hydrogen flow rate.

In the same manner as in Example 1, an organic layer and a silicon nitride layer (except Si, N ingredient content: 97 mol %) were formed on a support.

The same gas of plasma-CVD starting gas formulation 1 as that used in Example 1 was applied onto it, for a period of time necessary for forming a silicon nitride layer having a thickness of about 50 nm thereon. Next, while the plasma generation condition was kept as such without stopping the power application, the gas to be applied was changed to the same gas of plasma-CVD starting gas formulation 2 as that used in Example 1. The gas of plasma-CVD starting gas formulation 2 was applied to it for a period of time necessary for forming a silicon hydronitride layer having a thickness of about 100 nm. Next, while the plasma generation condition was still kept as such without stopping the power application, the gas to be applied was changed to the gas of plasma-CVD starting gas formulation 1. The gas of plasma-CVD starting gas formulation 1 was applied to it for a period of time necessary for forming a silicon nitride layer having a thickness of about 50 nm; and thereafter the power application was stopped.

In this Example, the total thickness of the inorganic layers was 200 nm±10 nm.

Example 3

Figure 3:
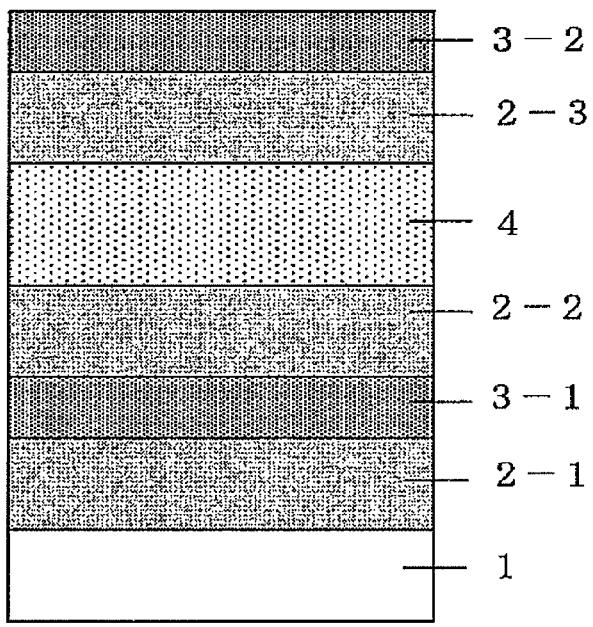
FIG. 3 shows the layer constitution of the gas-barrier film produced in Example 3.

A gas-barrier film having a layer constitution shown in FIG. 3 was produced. In FIG. 3, 1 is a polyethylene naphthalate film, 2-1, 2-2 and 2-3 each are an organic layer, 3-1 and 3-2 each are a silicon nitride layer, 4 is a silicon hydronitride layer.

According to the process of Example 1 and Example 2, a support, an organic layer, a silicon nitride layer (having a thickness of 50 nm; except Si, N ingredient content, 97 mol %), an organic layer, a silicon hydronitride layer (having a thickness of 150 nm; except Si, N ingredient content, 36 mol %; H ingredient content, 63 mol %), an organic layer, a silicon nitride layer (having a thickness of 50 nm; except Si, N ingredient content, 97 mol %) were formed in that order.

Example 4

This is the same as in Example 1, in which, however, the acrylate monomer for the organic layer was changed to 20 g of the following compound.

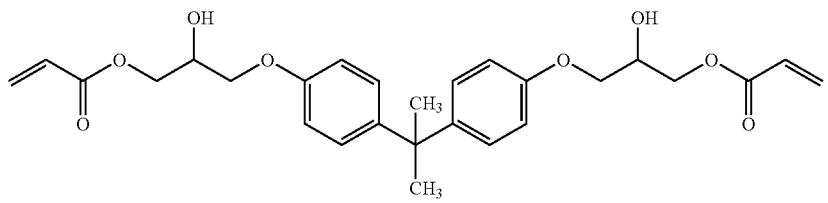

[Formula 10]

Comparative Example 1

Figure 4:
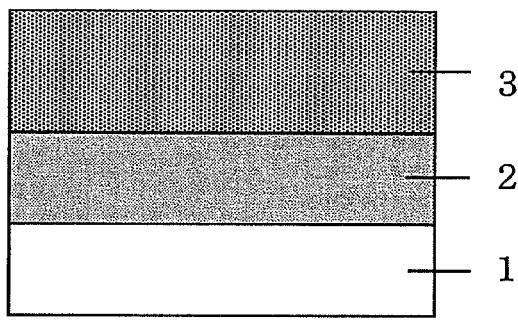
FIG. 4 shows the layer constitution of the gas-barrier film produced in Comparative Example 1.

A gas-barrier film having a layer constitution shown in FIG. 4 was produced. In FIG. 4, 1 is a polyethylene naphthalate film, 2 is an organic layer, 3 is a silicon nitride layer.

According to the process of Example 1 and Example 2, a support, an organic layer, and a silicon nitride layer (having a thickness of 200 nm; except Si, N ingredient content, 97 mol %) were formed in that order Test for Evaluation of Water Vapor Barrier Capability:

The gas-barrier films produced in the above Examples 1 to 3 and Comparative Example 1 were tested for the water vapor permeation at 40° C. and 90% RH, using a water vapor permeability tester (MOCON's PERMATRAN-W3/31). The detection limit is 0.005 g/m$^2$/day.

In the test, each gas-barrier film was tested before folded and after folded by a radius of curvature of 20 mm (20 mmR) repeatedly for a total of 100 times, and the data are shown in Table 1. In the test, the gas-barrier film was folded according to a cylindrical mandrel method (JIS K5600-5-1).

TABLE 1

| | Water Vapor Permeation (g·m$^{-2}$·day$^{-1}$) | |
|---|---|---|
| | before folded | after folded |
| Example 1 | less than 0.005 | 0.008 |
| Example 2 | less than 0.005 | less than 0.005 |
| Example 3 | less than 0.005 | less than 0.005 |
| Example 4 | less than 0.005 | 0.008 |
| Comparative Example 1 | 0.01 | 0.90 |

As is obvious from the above Table 1, the gas-barrier films of the invention having a laminate layer constitution of a silicon nitride layer and a silicon hydronitride layer all have better water vapor-barrier capability than the conventional gas-barrier film, and in addition, the gas-barrier films of the invention have excellent folding resistance. In particular, in Example 2, the film has a layer constitution of a hydrogen composition-changing layer, a silicon hydronitride layer and a hydrogen composition-changing layer continuously formed in that order, and therefore its folding resistance is better than that of the gas-barrier film of Example 1. In Example 3, the film has plural organic layers, these layers act as a stress-relaxing layer in the film. Accordingly, as compared with that of Example 1, the gas-barrier film of Example 3 has better folding resistance.

Example 4

Production and Evaluation of Organic EL Device (1) Production of Organic EL Device:

An ITO film-having conductive glass substrate (surface resistivity, 10 Ω/square) was washed with 2-propanol, and then processed for UV ozone treatment for 10 minutes. On the substrate (anode), the following layers were formed in order by vapor deposition according to a vacuum vapor deposition method.
(First Hole Transportation Layer)
 Copper phthalocyanine: film thickness 10 nm.
(Second Hole Transportation Layer)
 N,N'-diphenyl-N,N'-dinaphthylbenzidine: film thickness 40 nm.
(Light-Emitting Layer Also Serving as Electron Transportation Layer)
 Tris(8-hydroxyquinolinato) aluminium: film thickness 60 nm.

Finally, 1 nm of lithium fluoride and 100 nm of metal aluminium were formed in order by vapor deposition, thereby forming a cathode; and a silicon nitride film having a thickness of 5 µm was formed on it according to a parallel plate CVD method, thereby constructing an organic EL device.
(2) Application of Gas-Barrier Film on Organic EL Device:

Using a thermosetting adhesive (Epotec 310, by Daizo-Nichimori), the gas-barrier film produced in Example 1 or Example 2 was stuck to the organic EL device, and heated at 65° C. for 3 hours to cure the adhesive. 20 test pieces of every sample of the thus sealed organic EL device were prepared.

(3) Evaluation of Light-Emitting Surface of Organic EL Device:

Just after produced, the organic EL device was tested for light emission under application of 7 V thereto, using a source measure unit (SMU2400 Model by Keithley). Using a microscope, the light-emitting surface was observed, which confirmed uniform light emission by every device with no dark spot. It was further confirmed that, after left in an environment at 60° C. and 90% RH for 500 hours, all the devices could still emit uniform light with no dark spot.

The gas-barrier film of the invention has extremely excellent water vapor-barrier properties. In addition, the gas-barrier film of the invention can still keep its excellent water vapor-barrier properties even though folded. Accordingly, the gas-barrier film of the invention can be effectively used in broad applications, for example, typically for flexible organic EL devices.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 241966/2007 filed on Sep. 19, 2007 and Japanese Patent Application No. 140981/2008 filed on May 29, 2008, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas-barrier film comprising at least one silicon hydronitride layer and at least one silicon nitride layer on a surface of a flexible supporting substrate;
 wherein the flexible supporting substrate is a plastic film;
 wherein the silicon hydronitride layer and the silicon nitride layer are in direct contact with each other and laminated to each other; and
 wherein no definite boundary exists between the silicon hydronitride layer and the silicon nitride layer and the composition continuously changes from the silicon hydronitride layer to the silicon nitride layer.

2. The gas-barrier film according to claim 1, wherein the silicon nitride layer contains silicon oxynitride.

3. The gas-barrier film according to claim 1, wherein the silicon hydronitride layer contains silicon hydroxynitride.

4. The gas-barrier film according to claim 1, wherein the nitrogen content of the ingredients except silicon in the silicon hydronitride layer is at most 45 mol %, and the hydrogen content thereof is at least 30 mol %.

5. The gas-barrier film according to claim 1, wherein the thickness of the silicon hydronitride layer is from 50 to 300 nm.

6. The gas-barrier film according to claim 1, wherein the thickness of the silicon nitride layer is from 10 to 300 nm.

7. The gas-barrier film according to claim 1, which comprises at least one organic layer.

8. The gas-barrier film according to claim 7, wherein the organic layer is formed by curing a composition comprising at least one of a bifunctional methacrylate and a trifunctional methacrylate.

9. The gas-barrier film according to claim 7, wherein the organic layer comprises at least one of a bifunctional acrylate and a trifunctional acrylate.

10. The gas-barrier film according to claim 7, wherein the organic layer is formed by curing a composition comprising at least one bisphenol-based (meth)acrylate.

11. The gas-barrier film according to claim 1, wherein the flexible supporting substrate is a polyester.

12. An organic device comprising the gas-barrier film of claim 1.

13. The organic device according to claim 12, wherein the gas-barrier film is used for sealing.

14. The organic device according to claim 12, wherein the organic device comprises an organic device material on the surface of the gas-barrier film as a substrate, and the organic device material is laminated on the side of the inorganic layer formed on the flexible supporting substrate.

15. The organic device according to claim 12, which is an organic electroluminescent display device, a liquid-crystal display device, a touch panel or a solar cell.

* * * * *